(12) United States Patent
Koshiyama et al.

(10) Patent No.: US 8,409,360 B2
(45) Date of Patent: Apr. 2, 2013

(54) CLEANING METHOD FOR A PROCESS OF LIQUID IMMERSION LITHOGRAPHY

(75) Inventors: Jun Koshiyama, Kanagawa (JP); Jiro Yokoya, Kanagawa (JP); Tomoyuki Hirano, Kanagawa (JP); Hiromitsu Tsuji, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 162 days.

(21) Appl. No.: 12/662,760

(22) Filed: May 3, 2010

(65) Prior Publication Data

US 2011/0056511 A1 Mar. 10, 2011

Related U.S. Application Data

(63) Continuation of application No. 12/585,329, filed on Sep. 11, 2009, now abandoned, which is a continuation of application No. 12/084,325, filed as application No. PCT/JP2006/321477 on Oct. 27, 2006, now abandoned.

(30) Foreign Application Priority Data

Oct. 31, 2005 (JP) ................................. 2005-317541

(51) Int. Cl.
*B08B 9/00* (2006.01)
*C11D 1/66* (2006.01)

(52) U.S. Cl. ...................... 134/22.19; 134/22.1; 510/171

(58) Field of Classification Search .................... 355/30, 355/53; 134/22.1, 22.19, 29, 36; 510/171, 510/175

See application file for complete search history.

(56) References Cited

U.S. PATENT DOCUMENTS

| | | | |
|---|---|---|---|
| 2005/0205108 A1* | 9/2005 | Chang et al. | ...................... 134/1 |
| 2005/0274898 A1 | 12/2005 | Watanabe et al. | |
| 2006/0023185 A1 | 2/2006 | Hazelton et al. | |
| 2006/0103818 A1 | 5/2006 | Holmes et al. | |
| 2007/0091287 A1* | 4/2007 | Chang et al. | ...................... 355/30 |

FOREIGN PATENT DOCUMENTS

| | | |
|---|---|---|
| JP | 9-241686 | 9/1997 |
| JP | 9-299082 | 11/1997 |
| JP | 2001-003099 | 1/2001 |
| JP | 2001-183580 | 7/2001 |
| JP | 2001-242427 | 9/2001 |
| JP | 2001-271098 | 10/2001 |
| JP | 2004-024715 | 1/2004 |
| JP | 2005-72404 | 3/2005 |
| JP | 2005-79222 | 3/2005 |
| JP | 2005-79239 | 3/2005 |
| WO | 2004/050266 | 6/2004 |
| WO | 2004/093130 | 10/2004 |
| WO | 2007/052544 | 5/2007 |

OTHER PUBLICATIONS

Hoffnagle et al., "Liquid immersion deep-ultraviolet interferometric lithography",Journal of Vacuum Science & Technology B, vol. 17, No. 6, American Vacuum Society, Nov./Dec. 1999, pp. 3306-3309.
M. Switkes and M. Rothschild, "Immersion lithography at 157 nm", Journal of Vacuum Science & Technology B, vol. 19, No. 6, American Vacuum Society, Nov./Dec. 2001, pp. 2353-2356.
M. Switkes and M. Rothschild, "Resolution Enhancement of 157 nm Lithography by Liquid Immersion", Proceedings of SPIE vol. 4691, 2002, pp. 459-465.

* cited by examiner

*Primary Examiner* — Saeed T Chaudhry
(74) *Attorney, Agent, or Firm* — Wenderoth, Lind & Ponack, L.L.P.

(57) ABSTRACT

Problem: To provide a cleaning liquid and a cleaning method having excellent leaning capability. In a process of liquid immersion lithography, they can preventing the damage to be caused by the component released from the photoresist to photoexposure devices; the waste treatment is easy; the efficiency in substitution with the cleaning liquid for the medium for liquid immersion lithography is high, and the production cost is reduced not detracting from the throughput in semiconductor production.

Means for Solution: A cleaning liquid to be used for cleaning a photoexposure device in a process of liquid immersion lithography, which comprises at least 5% by mass of a nonionic surfactant containing at least one group selected from an ethyleneoxy group, a propyleneoxy group and a polyglycerin group, and a balance of water; and a cleaning method using it.

6 Claims, No Drawings

CLEANING METHOD FOR A PROCESS OF LIQUID IMMERSION LITHOGRAPHY

This is a continuation of Ser. No. 12/585,329 filed Sep. 11, 2009, now abandoned, which is a continuation of Ser. No. 12/084,325 filed Apr. 30, 2008, now abandoned, which is the National Stage of International Application No. PCT/JP2006/321477, filed Oct. 27, 2006.

TECHNICAL FIELD

The present invention relates to a cleaning liquid and to a cleaning method used for a process of liquid immersion lithography.

BACKGROUND ART

Photography is much used in fabrication of microstructures in various electronic devices such as semiconductor devices, liquid-crystal devices. Recently, the increase in the technical level of large-scale integration and microfabrication is great, and it is desired to further improve the technique of photoresist micropatterning in photolithography.

At present, for example, photolithography in the forefront of the region of high-technology has made it possible to form a photoresist micropattern having a line width of 90 nm or so, and further studies and developments are being made for micropatterning to a higher level to a line width of 65 nm or so.

For attaining micropatterning to such a higher level, in general, some methods of improving photoexposure devices or photoresist materials may be taken into consideration. Regarding the method of improving photoexposure devices, there may be mentioned a method of employing short-wave light sources of $F_2$ excimer laser, EUV (extreme-ultraviolet ray), electron ray, X ray, soft-X ray, and a method of employing lenses having an increased numerical aperture (NA).

However, the method of employing such short-wave light sources requires an additional expensive photoexposure unit. On the other hand, the method of employing such increased-NA lenses is problematic in that, since the resolution and the focal depth range are in a trade-off relationship, the increase in the resolution may lower the focal depth range.

Recently, liquid immersion lithography has been reported as a technique of photolithography capable of solving these problems (for example, see Non-Patent References 1 to 3). This method is for photoresist patterning through photoexposure of a photoresist film formed on a substrate, in which, in the photoexposure light pathway between the photoexposure device (lens) and the photoresist film, a liquid for liquid immersion lithography having a predetermined thickness is made to be on at least the photoresist film, and the photoresist film is exposed to light in that condition to thereby form a photoresist pattern. In the method of liquid immersion lithography, the photoexposure light pathway space, which is an inert gas such as air or nitrogen in conventional methods, is substituted with a liquid for liquid immersion lithography having a larger refractive index than that of the space (vapor) and having a smaller refractive index (n) than that of the photoresist film (for example, pure water, fluorine-containing inert liquid), and the advantage of the method is that, even though a photoexposure light source having the same wavelength level as that in conventional methods is used therein, the method may attain a high-level resolution like the case that uses a photoexposure light having a shorter wavelength or uses a high-NA lens and, in addition, the method does not result in the reduction in the focal depth range.

To that effect, the process of liquid immersion lithography is much noticed in the art, since it realizes photoresist patterning of high resolution to a good focal depth at low costs, using any lens actually mounted on the existing photoexposure devices therein.

However, in the process of liquid immersion lithography, the photoexposure is attained while a medium for liquid immersion lithography is made to be between the lens for photoexposure and the photoresist film, and therefore the method is problematic in that the photoexposure device may be damaged by the component released from the photoresist film into the medium for liquid immersion lithography (for example, the crystal material for the lens for photoexposure may be fogged, and as triggered by it, the transmittance of the lens may be lowered and the exposure may be uneven).

To solve the problem, employed are a method of improving the photoresist material to thereby prevent it from releasing the constitutive component, and a method of providing a layer of a protective film on the photoresist layer to thereby prevent the photoresist from releasing the constitutive component. However, the former method is limited in its development in point of the photoresist material and has another problem in that it could be hardly applicable to a wide variety of photoresists; and even the latter method could not completely prevent the photoresist from releasing the constitutive component.

Given that situation, another method of solving the above-mentioned problem has been proposed, still using the photoresist and the protective film now widely used in the art. The method comprises cleaning the optical lens member of the photoexposure device that is kept in contact with the medium for liquid immersion lithography, using a cleaning liquid (for example, see Patent Reference 1).

However, the cleaning liquid described in the patent publication comprises an organic, ketone-type or alcohol-type solvent; and when the organic solvent is used in the cleaning liquid and when the cleaning liquid and water used as the medium for liquid immersion lithography have the same flow line, then the waste treatment is difficult; and in addition, the cleaning liquid has another problem in that, when the cleaning liquid remaining between the lens and the photoresist layer is replaced with a medium for liquid immersion lithography in a process of photoexposure, it requires a time-consuming additional step of drying the photoexposure device prior to the liquid replacement. Further, the effect of the method of removing the component released from photoresist, which is a high-risk factor of contamination, is insufficient, and the method could hardly keep the optical properties of photoexposure devices.

Non-Patent Reference 1: "Journal of Vacuum Science & Technology B", USA, 1999, Vol. 17, No. 6, pp. 3306-3309
Non-Patent Reference 2: "Journal of Vacuum Science & Technology B", USA, 2001, Vol. 19, No. 6, pp. 2353-2356
Non-Patent Reference 3: "Proceedings of SPIE", USA, 2002, Vol. 4691, pp. 459-465
Patent Reference 1: JP-2005-157259A

DISCLOSURE OF THE INVENTION

Problems that the Invention is to Solve

The present invention has been made in consideration of the above-mentioned situation, and its object is to provide a cleaning liquid having excellent cleaning capability and applicable to a process of liquid immersion lithography that uses photoresist and protective film now widely used in the art. The cleaning liquid is effective for reducing the damage of photoexposure devices caused by the components released from photoresist, its waste treatment is easy, and its substitution with a medium for liquid immersion lithography is easy, and it contributes toward production cost reduction not detracting from the throughput in semiconductor production.

Means for Solving the Problems

For solving the above-mentioned problems, the invention provides a cleaning liquid to be used for cleaning a photoexposure device in a process of liquid immersion lithography, which comprises at least 5% by mass of a nonionic surfactant containing at least one group selected from an ethyleneoxy group, a propyleneoxy group and a polyglycerin group, and a balance of water.

The invention also provides the above cleaning liquid that further contains an organic solvent in an amount of less than 50% by mass.

The invention also provides a cleaning method in a process of liquid immersion lithography that comprises using a photoexposure device provided with at least an optical lens member, a wafer stage, a liquid-introducing flow line and a liquid-discharging flow line, introducing a medium for liquid immersion lithography into the space between the optical lens member and the object for photoexposure mounted on the wafer stage, through the liquid-introducing flow line, then thus filling the space with the medium for liquid immersion lithography and simultaneously discharging the medium for liquid immersion lithography through the liquid-discharging flow line to attain photoexposure; the cleaning method comprises introducing, after photoexposure, the above-mentioned cleaning liquid through the same introducing flow line as that used for the introduction of the medium for liquid immersion lithography and making the cleaning liquid in contact with the optical lens member for a predetermined period of time so as to clean the optical lens member, and discharging the used cleaning liquid through the same discharging flow line as that used for the discharging of the medium for liquid immersion lithography.

The invention also provides a cleaning method in a process of liquid immersion lithography that comprises filling the space between the optical lens member of a photoexposure device and an object for photoexposure mounted on the wafer stage, with a medium for liquid immersion lithography; the cleaning method comprises, after photoexposure, spraying the above-mentioned cleaning liquid on the optical lens member, or wiping the optical lens member with a cloth sprayed with the cleaning liquid, thereby to clean the optical lens member.

Advantages of the Invention

According to the invention, there are provided a cleaning liquid having excellent cleaning capability and a cleaning method using it. The cleaning liquid has high cleaning capability, not causing damage to the crystal material for lenses for photoexposure; and its waste treatment is easy; its substitution with a medium for liquid immersion lithography is easy; and it contributes toward production cost reduction not detracting from the throughput in semiconductor production.

BEST MODE FOR CARRYING OUT THE INVENTION

The invention is described in detail hereinunder.

The cleaning liquid of the invention contains at least 5% by mass of a nonionic surfactant having at least one group selected from an ethyleneoxy group, a propyleneoxy group and a polyglycerin group, and water.

The nonionic surfactant is preferably at least one selected from alkyl ethers and/or esters having from 5 to 25 carbon atoms, fatty acid ethers and/or esters, sorbitan acid ethers and/or esters, and acetylene glycol ethers and/or esters, having at least one group selected from an ethyleneoxy group, a propyleneoxy group and a polyglycerin group.

Above all, preferred for use herein are polyoxyethylene (hereinafter this may be referred to as "POE") alkyl ethers, POE sorbitan acid esters, POE fatty acid esters, POE acetylene glycol ethers.

POE alkyl ethers include POE lauryl ether, POE oleyl ether, POE stearyl ether, POE behenyl ether, POE octyldodecyl ether, POE cholestanol ether.

POE fatty acid esters include POE monooleate, POE distearate, POE monooleate.

The amount of the nonionic surfactant is at least 5% by mass in the cleaning liquid of the invention, preferably from 5 to 30% by mass, more preferably from 7 to 25% by mass. The amount falling within the defined range brings about the advantages that the cleaning liquid reduces the damage to the photoexposure devices by the component released from photoresist, the waste treatment is easy, the efficiency in substitution with the cleaning liquid for the medium for liquid immersion lithography is high, the production cost is reduced not detracting from the throughput in semiconductor production, and the cleaning liquid has excellent cleaning capability.

The cleaning liquid of the invention contains water as the balance. Water is preferably pure water, deionized water or the like.

The cleaning liquid of the invention may further contain an organic solvent. The organic solvent is preferably at least one selected from alkanolamines, alkylamines, polyalkylene-polyamines, glycols, ethers, ketones, acetates, and carboxylates.

The alkanolamines include monoethanolamine, diethanolamine, triethanolamine, 2-(2-aminoethoxy)ethanol (=diglycolamine), N,N-dimethylethanolamine, N,N-diethylethanolamine, N,N-dibutylethanolamine, N-methylethanolamine, N-ethylethanolamine, N-butylethanolamine, N-methyldiethanolamine, monoisopropanolamine, diisopropanolamine, triisopropanolamine. However, the invention should not be limited to these examples.

The alkylamines include 2-ethyl-hexylamine, dioctylamine, tributylamine, tripropylamine, triallylamine, heptylamine, cyclohexylamine. However, the invention should not be limited to these examples.

The polyalkylene-polyamines include diethylenetriamine, triethylenetetramine, propylenediamine, N,N-diethylethylenediamine, N,N'-diethylethylenediamine, 1,4-butanediamine, N-ethyl-ethylenediamine, 1,2-propanediamine, 1,3-propanediamine, 1,6-hexanediamine. However, the invention should not be limited to these examples.

The glycols include ethylene glycol, diethylene glycol, propylene glycol, glycerin, 1,2-butylene glycol, 1,3-butylene glycol, 2,3-butylene glycol. However, the invention should not be limited to these examples.

The ethers include ethylene glycol monomethyl ether (=methyl cellosolve), ethylene glycol monoethyl ether (=ethyl cellosolve), ethylene glycol diethyl ether, ethylene glycol diisopropyl ether, ethylene glycol mono-n-butyl ether, propylene glycol monomethyl ether, propylene glycol monoethyl ether, diethylene glycol monomethyl ether, diethylene glycol monoethyl ether, diethylene glycol mono-n-butyl ether (=butyldiglycol), diethylene glycol dimethyl ether, diethylene glycol diethyl ether, dipropylene glycol monomethyl ether, benzyl ethyl ether, dihexyl ether. However, the invention should not be limited to these examples.

The ketones include acetone, methyl ethyl ketone, diethyl ketone, methyl propyl ketone, methyl isobutyl ketone, methyl amyl ketone, diisopropyl ketone, cyclobutanone, cyclopentanone, cyclohexanone. However, the invention should not be limited to these examples.

The acetates include ethylene glycol monomethyl ether acetate (=methyl cellosolve acetate), ethylene glycol monoethyl ether acetate (ethyl cellosolve acetate), ethylene glycol mono-n-butyl ether acetate (=n-butyl cellosolve acetate), propylene glycol monomethyl ether acetate. However, the invention should not be limited to these examples.

The carboxylates include, for example, alkyl- or aliphaticcarboxylates, and monohydroxycarboxylates; concretely including methyl lactate, ethyl lactate, methyl acetate, ethyl acetate, propyl acetate, butyl acetate, amyl acetate, isoamyl acetate. However, the invention should not be limited to these examples.

In the invention, alkanolamines, glycols, ethers, ketones, acetates and carboxylates are preferred for the above organic solvent.

In case where an organic solvent is added to the cleaning liquid of the invention, its content is preferably less than 50% by mass, more preferably from 1% by mass to less than 50% by mass, even more preferably from 3 to 30% by mass. The content falling within the defined range brings about the advantages that the cleaning liquid reduces the damage to the photoexposure devices by the component released from photoresist, the waste treatment is easy, the efficiency in substitution with the cleaning liquid for the medium for liquid immersion lithography is high, the production cost is reduced not detracting from the throughput in semiconductor production, and the cleaning liquid has excellent cleaning capability.

The cleaning method with the cleaning liquid of the invention is, for example, as follows:

First, an ordinary photoresist composition is applied on a substrate such as silicon wafer as an object for photoexposure, using a spinner, and then prebaked (PAB treatment) to form a photoresist film thereon. As the case may be, after one layer of an organic or inorganic antireflection film (underlayer antireflection film) is formed on the substrate, the photoresist film may be formed thereon.

Not specifically defined, the photoresist composition may be any photoresist developable with an aqueous alkali solution, including negative and positive photoresists. The photoresist includes (i) a positive photoresist that contains a naphthoquinonediazide compound and a novolak resin, (ii) a positive photoresist that contains a compound capable of generating an acid through exposure to light, a compound capable of decomposing with an acid to have an increased solubility in aqueous alkali solution, and an alkali-soluble resin, (iii) a positive photoresist that contains a compound capable of generating an acid through exposure to light, and an alkali-soluble resin having a group capable of decomposing with an acid to have an increased solubility in aqueous alkali solution, and (iv) a negative photoresist that contains a compound capable of generating an acid or a radical by light, a crosslinking agent and an alkali-soluble resin. However, the invention should not be limited to these.

As the case may be, a protective film may be formed on the surface of the photoresist film.

Next, the substrate with the photoresist film formed thereon is mounted on a wafer stage of a photoexposure device. Preferably, the photoexposure device comprises, in addition to the wafer stage, an optical lens member disposed above the wafer stage to face it, as spaced from it by a predetermined distance therebetween, and additionally comprises a liquid introducing flow line and a liquid discharging flow line.

Next, a medium for liquid immersion lithography is introduced into the space between the photoresist film-having substrate and the optical lens member in one direction to the wafer stage through the liquid introducing flow line, and at the same time with it, the medium for liquid immersion lithography is discharged (drawn) out in the other direction from the wafer stage through the liquid discharging flow line, and in that condition while the space is filled with the medium for liquid immersion lithography, the photoresist film is selectively exposed to light through a mask pattern.

In a process of local liquid immersion lithography, while the photoexposure lens is scanned at high speed and while a medium for liquid immersion lithography is continuously dropwise applied onto the photoresist film through a liquid introducing nozzle (liquid introducing flow line), the photoresist film is selectively exposed to light. The photoresist film on the substrate, onto which a medium for liquid immersion lithography is continuously dropwise applied, is selectively exposed to light through a mask pattern. The excessive medium for liquid immersion lithography is discharged out through the liquid discharging nozzle (liquid discharging flow line).

Apart from the above, also employable is a method of exposing the photoresist layer-having substrate to light, while the substrate is kept immersed in a medium for liquid immersion lithography.

Under any condition as above, at least the space between the lens and the photoresist layer-having substrate is filled with a medium for liquid immersion lithography.

In that condition, the photoresist film on the substrate is selectively exposed to light through a mask pattern. Accordingly, in this stage, the photoexposure light reaches the photoresist film after having passed via the medium for liquid immersion lithography.

In this stage, the photoresist-constituting component may be released from the photoresist film and may dissolve in the medium for liquid immersion lithography, and it may adhere to the photoexposure device as a contaminant thereto.

The photoexposure light is not specifically defined, for which usable are any radiations such as ArF excimer laser, KrF excimer laser, $F_2$ excimer laser, EB, EUV, VUV (vacuum ultraviolet ray).

Not specifically defined, the medium for liquid immersion lithography may be any liquid having a refractive index larger than that of air and smaller than that of the photoresist film used (object for photoexposure). In the invention, preferably used is a liquid having a refractive index of at least 1.44 that is smaller than the refractive index of the photoresist film used as so mentioned in the above, for improving the resolution. The medium for liquid immersion lithography of the type includes water (pure water, deionized water; refractive index 1.44), liquids containing various additives added thereto for increasing the refractive index, fluorine-containing inert liquids, silicon-based inert liquids, hydrocarbon liquids. In addition, also usable herein is a medium for liquid immersion lithography having high-refractivity characteristics, which may be developed in near future. Specific examples of the fluorine-containing inert liquids are liquids comprising, as the principal ingredient thereof, a fluorine-containing compound such as $C_3HCl_2F_5$, $C_4F_9OCH_3$, $C_4F_9OC_2H_5$, $C_5H_3F_7$. Of those, preferred is water (pure water, deionized water) in a case of using a photoexposure light having a wavelength of 193 nm (e.g., ArF excimer laser), from the viewpoint of the cost, the safety, the environmental problem and the wide-range applicability thereof. However, when a photoexposure light having a wavelength of 157 nm (e.g., $F_2$ excimer laser) is used, then preferred for it is a fluorine-containing solvent from the viewpoint that the absorption of the photoexposure light by the solvent is small.

After the step of photoexposure in liquid immersion as above, the substrate is taken out of the medium for liquid immersion lithography, and then the liquid is removed from the substrate.

Next, the cleaning liquid of the invention is brought into contact with the site that was contacted with the medium for liquid immersion lithography in the photoexposure device, especially the optical lens member, whereby the component released from the photoresist film is removed and cleaned off. Not specifically defined, the contact time may well be a period of time within which the photoresist-released component could be removed and cleaned off; and in general, it may be from 30 seconds to 10 minutes or so. Accordingly, even though a component released from a photoresist film has adhered to the photoexposure device, especially to the optical lens member, it may be immediately removed, and therefore, the invention secures high-definition photoexposure treatment all the time in a cleaned condition. Through the photoexposure, a photoresist pattern of high reliability can be formed.

The cleaning liquid of the invention is so constituted that it contains an organic solvent and water in a predetermined ratio, and therefore, it may be used through the same flow lines as those used in introduction and discharging of the medium for liquid immersion lithography. Accordingly, the cleaning liquid does not require any additional flow lines for it, therefore contributing to production cost reduction.

For bringing the cleaning liquid into contact with the optical lens member, any other method than the above may also be employed. For example, the cleaning liquid of the invention may be directly sprayed on the optical lens member, or the optical lens member may be wiped with a cloth sprayed with the cleaning liquid, whereby the optical lens member may be cleaned.

The cleaning method is not limited to those exemplified in the above.

Next, the exposed photoresist film is subjected to PEB (post exposure baking), and then developed with an alkali developer comprising an aqueous alkali solution. The alkali developer may be any ordinary one. As a result of the alkali development treatment, the protective film is dissolved and removed along with the soluble part of the photoresist film. After the development, the substrate may be post-baked. Subsequently, this is rinsed with pure water or the like. The rinsing with water may be effected, for example, as follows: While the substrate is rotated, water is dropped or sprayed onto the surface of the substrate so that the developer and the protective film component and the photoresist composition having been dissolved by the developer are washed away. Then, this is dried, and the photoresist film is patterned in accordance with the profile of the mask pattern, thereby giving a photoresist pattern.

In that manner, a photoresist pattern is formed. Thus formed, the photoresist pattern has a microstructure of good resolution, and in particular it may be a line-and-space pattern having a small pitch.

EXAMPLES

The invention is described in more detail with reference to the following Examples, to which, however, the invention should not be limited.

Examples 1 to 6

Comparative Examples 1 to 4

A test tool of the following constitution was prepared for reproducing the contamination of a photoexposure lens in a condition of liquid immersion lithography.

First, a photoacid generator in a photoresist component, "TPS-PFBS (tetraphenylsulfonium perfluorobutane-sulfonate)", which is expected to be a cause of contamination of photoexposure lens, was dissolved in pure water, and the aqueous 500-ppm solution was used as a test chemical liquid.

Next, a transparent cell was disposed in the course of a duct structure, in which a liquid could flow at a constant flow rate, and the above test chemical liquid was introduced into the duct from its one end, while discharged out through the other side. A photoexposure lens for liquid immersion lithography was disposed on either one side of the transparent cell through which the duct was not disposed.

In the direction to the side of the cell on which the photoexposure lens for liquid immersion lithography was disposed, a pulse-wave ArF excimer laser was applied, and in that condition, the test liquid chemical was led to flow through the transparent cell with the photoexposure lens for liquid immersion lithography disposed therein.

The ArF excimer laser was pulsewise radiated as above, and this is because both the contamination caused by the photoacid generator as dissociated and ionized through irradiation with light and that caused by the photoacid generator not dissociated through no irradiation with light could be reflected as the contamination of the test tool to be the contamination in actual photoexposure.

Using the test tool of the constitution as above, the above-mentioned test chemical liquid was led to flow through it at a flow rate of 0.1 L/min, and with that, an ArF excimer laser was applied to it at an exposure level of 0.18 mJ at a pulse of $1.76 \times 10^5$, whereby the surface of the photoexposure lens was made to adsorb a contaminant.

The photoexposure lens for liquid immersion lithography with the contaminant adhering thereto was dipped in a cleaning liquid having the composition shown in Table 1 for 10 minutes, then subsequently rinsed with water for 30 seconds, and dried by nitrogen blowing; and then this was visually checked, and the cleaning effect for it was evaluated according to the following evaluation standards. The results are shown in Table 1.

[Evaluation Standards for Cleaning Effect]
○: Contaminant completely removed.
Δ: Contaminant remained but only slightly.
X: Contaminant remained.

TABLE 1

| | Composition of Cleaning Liquid (mas. %) | Cleaning Effect |
| --- | --- | --- |
| Example 1 | POE lauryl ether (10) + water (90) | ○ |
| Example 2 | POE sorbitan acid ester (10) + water (90) | ○ |
| Example 3 | POE lauryl acid ester (10) + water (90) | ○ |
| Example 4 | POE acetylene glycol ether (10) + water (90) | ○ |
| Example 5 | POE lauryl ether (10) + water (85) + PGME (5) | ○ |
| Example 6 | POE sorbitan acid ester (10) + water (85) + BDG (5) | ○ |
| Comparative Example 1 | BDG (100) | Δ |
| Comparative | water (100) | X |

TABLE 1-continued

|  | Composition of Cleaning Liquid (mas. %) | Cleaning Effect |
|---|---|---|
| Example 2 |  |  |
| Comparative Example 3 | water (99.8) + ATOH (0.2) | X |
| Comparative Example 4 | water (99.8) + POE lauryl ether (0.2) | X |

In Table 1, the abbreviations mean the following compounds.
PGME: propylene glycol monomethyl ether,
BDG: diethylene glycol mono-n-butyl ether (=dibutyl diglycol),
ATOH: acetylene alcohol-base surfactant.

As is obvious from the results in Table 1, it is known that the cleaning liquid of the invention has excellent cleaning capability.

INDUSTRIAL APPLICABILITY

The cleaning liquid and the cleaning method of the invention have excellent leaning capability, and in a process of liquid immersion lithography in which a photoresist and a protective film now widely used in the art are used, they can prevent the damage to be caused by the component released from the photoresist to photoexposure devices. In addition, the waste treatment is easy, the efficiency in substitution with the cleaning liquid for the medium for liquid immersion lithography is high, and the production cost is reduced not detracting from the throughput in semiconductor production.

The invention claimed is:

1. A cleaning method in a process of liquid immersion lithography that comprises using a photoexposure device provided with at least an optical lens member, a wafer stage, a liquid-introducing flow line and a liquid-discharging flow line, introducing a medium for liquid immersion lithography into a space between the optical lens member and an object for photoexposure mounted on the wafer stage, through the liquid-introducing flow line, then thus filling the space with the medium for liquid immersion lithography and simultaneously discharging the medium for liquid immersion lithography through the liquid-discharging flow line to attain photoexposure;

after photoexposure, introducing a cleaning liquid through the same introducing flow line as that used for the introduction of the medium for liquid immersion lithography and contacting the cleaning liquid with the optical lens member for a predetermined period of time so as to clean the optical lens member, and discharging the used cleaning liquid through the same discharging flow line as that used for the discharging of the medium for liquid immersion lithography, wherein the cleaning liquid comprises 7 to 25% by mass of polyoxyethylene lauryl ether, and a balance of water.

2. The cleaning method of claim 1, wherein cleaning of the photoexposure device is to clean a site of the photoexposure device that was kept in contact with the medium for liquid immersion lithography during photoexposure.

3. The cleaning method of claim 2, wherein the site of the photoexposure device that was kept in contact with the medium for liquid immersion lithography during photoexposure is the optical lens member.

4. The cleaning method of claim 1, which further contains an organic solvent in an amount of less than 50% by mass.

5. The cleaning method of claim 4, wherein the organic solvent is at least one selected from alkanolamines, alkylamines, polyalkylene-polyamides, glycols, ethers, ketones, acetates and carboxylates.

6. A cleaning method in a process of liquid immersion lithography that comprises filling a space between an optical lens member of a photoexposure device and an object for photoexposure mounted on a wafer stage, with a medium for liquid immersion lithography to attain photoexposure;

after photoexposure, spraying a cleaning liquid on the optical lens member, or wiping the optical lens member with a cloth sprayed with the cleaning liquid, thereby to clean the optical lens member, wherein the cleaning liquid comprises 7 to 25% by mass of polyoxyethylene lauryl ether, and a balance of water.

* * * * *